United States Patent [19]
Watanabe et al.

[11] Patent Number: 5,956,349
[45] Date of Patent: Sep. 21, 1999

[54] SEMICONDUCTOR MEMORY DEVICE FOR HIGH SPEED DATA COMMUNICATION CAPABLE OF ACCURATE TESTING OF PASS/FAIL AND MEMORY SYSTEM EMPLOYING THE SAME

[75] Inventors: Naoya Watanabe; Akira Yamazaki, both of Hyogo, Japan

[73] Assignee: Mitsubishi Denki Kabushiki Kaisha, Tokyo, Japan

[21] Appl. No.: 08/781,248

[22] Filed: Jan. 10, 1997

[30] Foreign Application Priority Data

Apr. 24, 1996 [JP] Japan .................................... 8-102583

[51] Int. Cl.$^6$ ........................................................ G06F 11/06
[52] U.S. Cl. ............................................................. 371/21.1
[58] Field of Search ................................. 371/21.1, 21.2, 371/21.3, 21.6; 365/201

[56] References Cited

FOREIGN PATENT DOCUMENTS 7-320481 12/1995 Japan .

OTHER PUBLICATIONS

Draft 0.77 IEEE P1596.7–199X "Draft Standard for a High–Speed Memory Interface (SyncLink)", by IEEE Standards Department, Jan. 3, 1996.

Primary Examiner—Vincent P. Canney
Attorney, Agent, or Firm—McDermott, Will & Emery

[57] ABSTRACT

A memory includes a built-in testing circuit for determining pass/fail of a memory portion and an identifier register for storing identification value for identifying the memory. The memory performs a testing operation according to a command provided from a controller via a send link and sends the result of that testing to a sync link. Thus, the memory controller can identify a defective memory cell. In this way, erroneous operation of the system due to a defective memory cell in a memory system can be prevented.

14 Claims, 6 Drawing Sheets 5,956,349

SEMICONDUCTOR MEMORY DEVICE FOR HIGH SPEED DATA COMMUNICATION CAPABLE OF ACCURATE TESTING OF PASS/FAIL AND MEMORY SYSTEM EMPLOYING THE SAME

BACKGROUND OF THE INVENTION

1. Field of the Invention

The present invention relates to a memory system and a semiconductor memory device to be employed therein, and particularly to a memory system capable of high speed data transfer and a semiconductor memory device for the same. More particularly, the present invention relates to "a SyncLink DRAM (Dynamic Random Access Memory)."

2. Description of the Background Art

Microprocessors are heightening their performance. In addition, storage capacity of DRAMs as memory devices is also increasing. However, operation speed of a DRAM is slower than that of a microprocessor, and thus large amount of data (including instructions) required by the microprocessor cannot be transferred at high speed between the DRAM and the processor. In order to meet this requirement of high speed data transfer, various types of high speed memory systems have been proposed, in which a plurality of DRAMs are connected in parallel via a bus and data transfer is performed successively in synchronization with a clock signal. In the following, a description is made of a memory system employing a "SyncLink DRAM" as its memory device, as an example of a high speed memory system.

FIG. 10A is a schematic diagram of a structure of a currently proposed memory system. Referring to FIG. 10A, the memory system includes a memory controller 1, a plurality of semiconductor memory devices (hereinafter referred to as DRAMs) DM0 to DM3 connected in parallel, a send link 10 commonly connected to these DRAMs DM0 to DM3 for transferring commands, addresses and data from controller 1, a sync link 20 commonly connected to DRAMs DM0 to DM3 for transferring data read out from these DRAMs DM0 to DM3 to controller 1, and a control signal line 30 for successively transferring control signals for setting identifiers (slave IDs) to DRAMs DM0 to DM3.

Maximum number of DRAMs which can be supported is 63. Send link 10 and sync link 20 are connected to each of the DRAMs DM0 to DM3 such that the sum of the length of the access request path from controller 1 and the length of access response (i.e., data return) path to controller 1 would be equal for all DRAMs DM0 to DM3. More specifically, sync link 20 is connected to respective DRAMs DM0 to DM3, and includes a portion for transferring data in a direction from DRAM DM0 to DRAM DM3 as well as a portion for transferring data (response) in a direction from DRAM DM3 to controller 1.

In this memory system shown in FIG. 10A, DRAMs DM0 to DM3 are uniquely allocated with an identifier (slave ID), respectively. Controller 1 uses these slave IDs to make an access to DRAMs DM0 to DM3. As for send link 10 and sync link 20 in this memory system, all of the information is sent out in a packet form. In addition, send link 10 is of an 8-bit or 9-bit width, while sync link 20 is of a 16-bit or 18-bit width. The send link 10 sends out information in synchronization with both rising and falling edges of the clock not shown, while the sync link 20 transmits information in synchronization with one of the edges of this clock signal. Also, since information is transferred by using two busses, namely send link 10 and sync link 20, when access request to DRAMs DM0 to DM3 via send link 10 occurs, data can also be read out from another DRAM via sync link 20, and thus a high speed data transfer is made possible. The slave IDs of this memory system are set as described in the following. In the following, description will be made of the setting sequence of the slave IDs with reference to FIGS. 10A to 10D.

Referring to FIG. 10A, controller 1 in broadcast mode sends a hard reset command rstHRD onto send link 10. In accordance with this hard reset command, DRAMs DM0 to DM3 set their own slave IDs at the initial value.

DRAMs DM0 to DM3 each have a select input SIN as an identifier input enable input node as well as a select output SOUT as an identifier set complete enable output node. These select input SIN and select output SOUT are interconnected by control signal line 30 through DRAMs DM0 to DM3. The DRAM can incorporate as its own identifier the value provided onto send link 10 when its select input SIN is at "1" and select output SOUT is at "0."

DRAMs DM0 to Dm3 each maintain this select output SOUT at value "0" while the slave ID is at an initial value of 62.

Referring to FIG. 10B, controller 1 sends identifier setting command cfgHRD onto send link 10 after initialization (reset) of DRAMs DM0 to DM3. This identifier setting command cfgHRD is sent out in the form of a packet which includes a node for indicating the number of the slave ID and a value to be incorporated as the identifier. Also, controller 1 sends out a signal "1" on control signal line 30 and activates select input SIN of DRAM DM0. Since DRAM DM0 has its select input SIN at an activated state "1" and its select output SOUT at an inactivated state "0," it updates the initialized slave ID value 62 to a value 0 provided onto send link 10 in accordance with this command cfgHRD.

DRAM DM0 sets this slave ID at "0" and then sends a signal of "1" to select output SOUT. Thus, DRAM DM0 indicates that setting of its identifier is completed, and enables slave ID to be input to DRAM DM1 of the next stage.

When the slave ID of DRAM DM0 is being set, DRAMs DM1 to DM3 each have its select input SIN and select output SOUT both at "0" and thus DRAMs DM1 to DM3 do not perform an identifier setting operation according to the command sent to this send link 10.

This operation shown in FIG. 10B is performed also to DRAM DM1.

Thereafter, as shown in FIG. 10C, controller 1 again sends identifier setting command cfgHRD onto send link 10. In the packet including this command, a node number as well as an identifier number (value) are also included. DRAM DM2 has its select input SIN set at "1" and select output SOUT at "0," and thus updates the slave ID from 62 to 2 according to this initial value setting command cfgHRD, and after this update of the slave ID, DRAM DM2 sets select output SOUT at "1."

Then, as shown in FIG. 10D, after a prescribed time period has passed (in other words, after a time period required for the setting of the slave ID of DRAM DM2 has passed), controller 1 again sends out identifier setting command cfgHRD along with node number 62 and value 3 as the identifier. DRAM DM3 updates its own slave ID from 62 to 3 according to this identifier setting command cfgHRD on send link 10, and outputs a signal "1" to select output SOUT. When controller 1 detects this return of signal "1" via control signal line 30, it acknowledges that setting of the slave IDs of all DRAMs, that is, DRAMs DM0 to DM3, is complete.

More specifically, controller 1 sends out this identifier setting command in repetition, successively incrementing its value until a signal "1" is returned via control signal line 30.

By returning back the signal "1", or in other words, an identifier setting complete signal via control signal line 30, it is made possible for controller 1 to successively set the slave IDs to the DRAMs included in the memory system even when it does not know how many DRAMs are included in the memory system. In addition, by returning back the identifier setting complete signal via this control signal line 30, it is made possible for controller 1 to acknowledge the number of DRAMs included in this memory system and that setting of the identifiers is complete.

In a conventional memory system, controller 1 successively increments the slave ID from 0. The value obtained by adding 1 to this slave ID indicates the distance between controller 1 and the DRAM. Accordingly, when controller 1 determines that there is an access failure during the use of this memory system, it informs the user the slave ID of the DRAM in which this access failure has occurred, so that the user can replace the defective DRAM.

However, when controller 1 does not detect this failure, the defective DRAM is put in use and there would be an erroneous operation in the system. Moreover, even if controller 1 does detect an access failure, it means that this defective DRAM has been used up to the point of time when this access failure was detected; there is no way to know with certainty that the process performed before this detection was accurate. Thus, a problem that system performance would be degraded arises.

Specifically, in the slave ID setting sequence of the DRAM, when select input SIN and select output SOUT are set at "1" and "0," respectively, the DRAM will have its slave ID set regardless of whether its internal circuit is defective or non-defective. Accordingly, the slave ID is set also to the DRAM which is already defective before the memory system is operated, and thus the defective DRAM is put into use. Therefore, there has been a problem that erroneous operation of the memory system is caused right from the time when the system has started its operation.

SUMMARY OF THE INVENTION

It is an object of the present invention to provide a memory system in which elimination of a defective memory device is ensured, and a semiconductor memory device for this memory system.

It is another object of the present invention to provide a memory system in which prevention of erroneous operation of the system owing to a memory device failure is ensured, and a semiconductor memory device for this memory system.

In a first aspect of the invention, each memory device includes an embedded testing circuit which is operated at the time of system initialization, and a memory controller is informed of the result of testing.

In a second aspect of the invention, each memory device includes an embedded testing circuit, and when this testing result indicates defective, setting of a slave ID (identifier) to the memory device is inhibited.

In a third aspect of the invention, each memory device includes an embedded testing circuit, and when this testing circuit detects a failure, a select output of the memory device is fixed at an inactivated state (i.e., "0").

In the first aspect of the invention, since the result of the testing by the embedded testing circuit is sent to the controller, the controller can acknowledge a defective memory device upon system initialization. Thus, it can inhibit the access to the defective memory device, so that erroneous operation of the system owing to the defective memory device can be prevented.

In the second aspect of the invention, setting of the slave ID (identifier) to a defective memory device is inhibited upon system initialization. Thus, the defective memory device is neglected by the controller and withdrawn from utilization, so that erroneous operation of the system owing to this defective memory device can be prevented.

In the third aspect of the invention, since a select output enable terminal of the defective memory device is fixed at an inactivated state (i.e., "0") by the embedded testing circuit, the controller can acknowledge the existence of a defective memory device in the memory system upon initialization since a slave ID setting complete signal is not returned even after the maximum value of the slave ID (identifier) is sent. Thus, by replacement or elimination of this defective memory device by the user, usage of the defective memory device upon actual processing operation can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
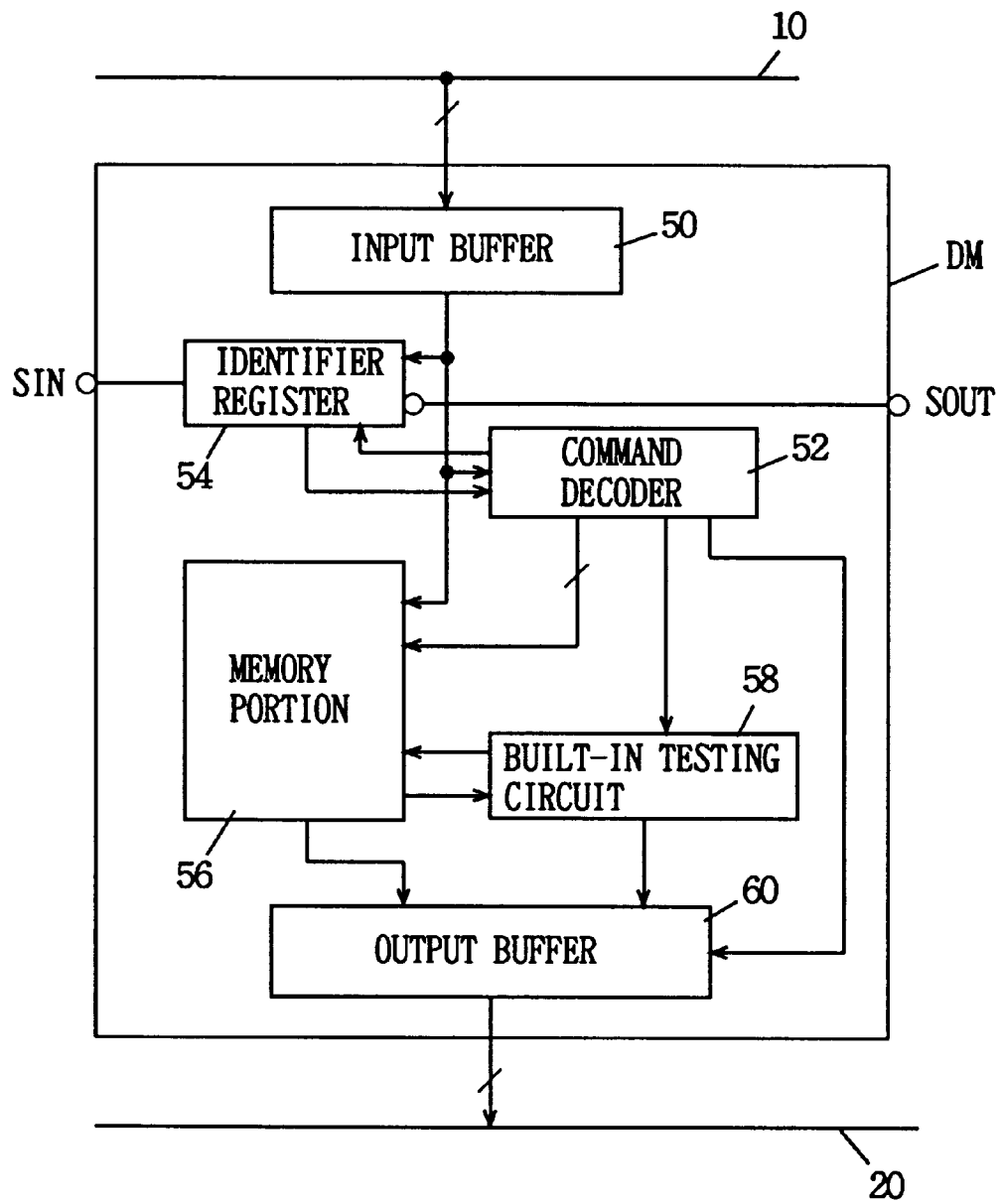
FIG. 1 is a schematic diagram showing the entire structure of a semiconductor memory device according to Embodiment 1 of the present invention.

FIG. 1 is a schematic diagram showing the structure of a semiconductor memory device according to the present invention. Referring to FIG. 1, a semiconductor memory device DM is coupled to a send link 10, and includes an input buffer 50 which acts as an interface for inputting information transmitted to this send link 10, a command decoder 52 for decoding the command applied via input buffer 50, determining the designated operation mode, and generating various types of control signals in accordance with the result of the determination, an identifier register 54 which is enabled, when a select input SIN is at H level ("1") and a select output node SOUT is at L level ("0"), for storing an slave ID transmitted from a memory controller via send link 10 and received via input buffer 50, a memory portion 56 which is activated/inactivated under the control of command decoder 52 for performing a memory cell selecting operation as well as data reading and data writing operations upon reception of address/write data applied from input buffer 50, a built-in testing circuit 58 which is activated under the control of command decoder 52 for performing a testing operation for this memory portion 56, and an output buffer 60 for selecting one of the outputs of memory portion 56 and built-in testing circuit 58 and transmitting the selected output to sync link 20 with a prescribed timing.

Command decoder 52 compares the slave ID (identifier) stored in identifier register 54 and the identifier provided through send link 10, and when the result of comparison indicates that they coincide, it performs a decoding operation of the command applied via send link 10 to generate a required internal control signal.

Memory portion 56 includes both a memory array in which a plurality of memory cells are arranged, and a peripheral control circuit for controlling selection of a memory cell in this memory array as well as writing/reading of the data.

Built-in testing circuit 58 stores a test program, and in accordance with this test program, generates upon start up a required test data which is provided to memory portion 56. This built-in testing circuit 58 also applies a control signal to a peripheral control circuit of memory portion 56 upon testing to operate memory portion 56.

Output buffer 60 is provided with a data latching function and latches one of the data read out from memory portion 56 and the test result information from built-in test circuit 58 according to the control signal from command decoder 52. Upon normal operation, output buffer 60 selects data read out from memory portion 56, and at the time of initialization described below, it outputs the test result information from built-in testing circuit 58.

Figure 2:
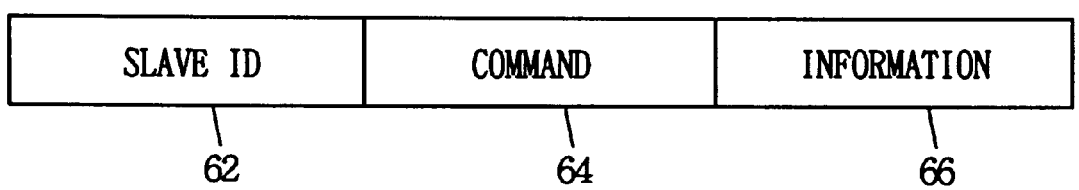
FIG. 2 is a schematic diagram showing the structure of a packet used in a memory system to which the present invention is applied.
Figure 3:
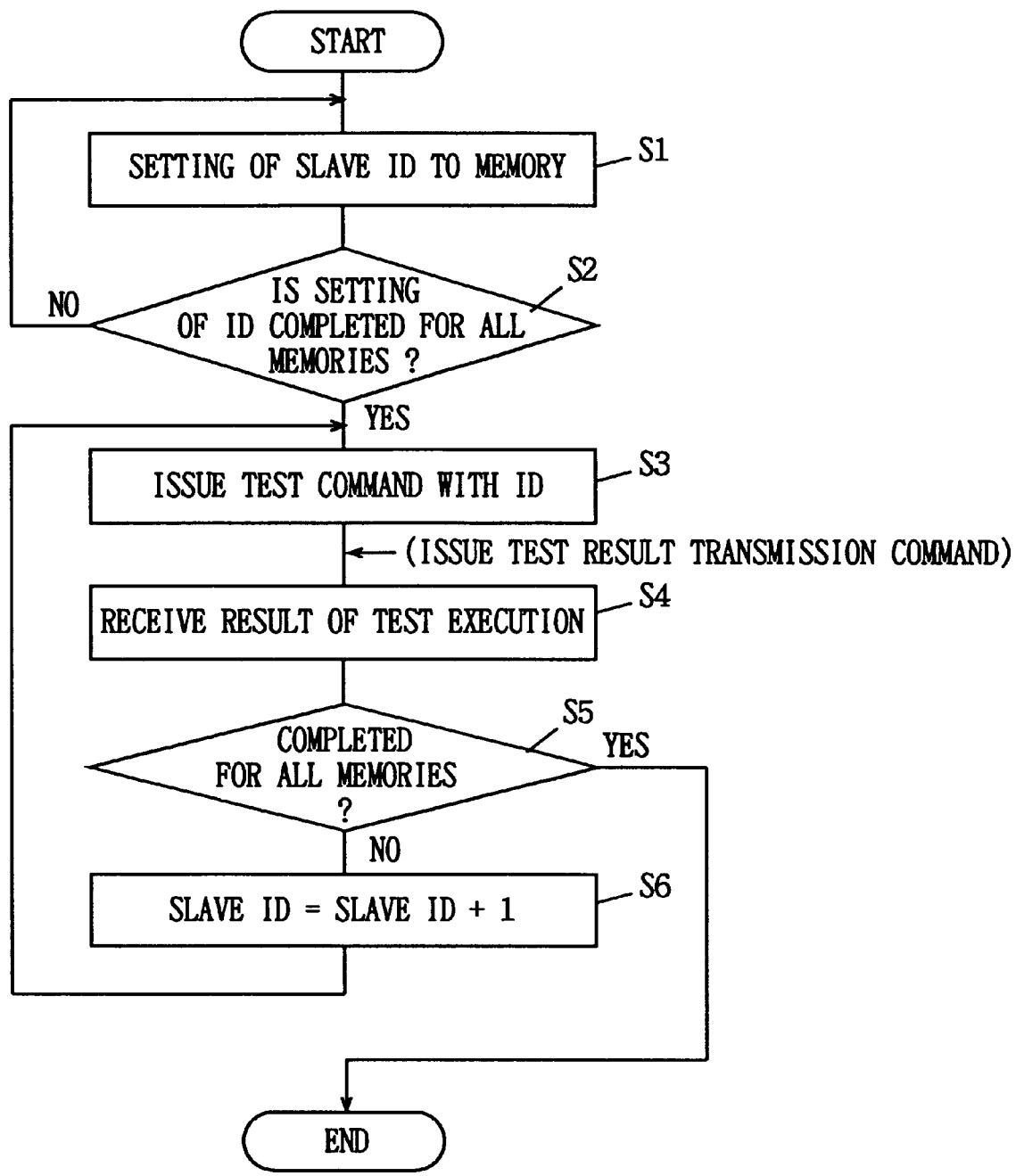
FIG. 3 is a flow chart representing the operation in Embodiment 1 of the present invention.
Figure 10A:
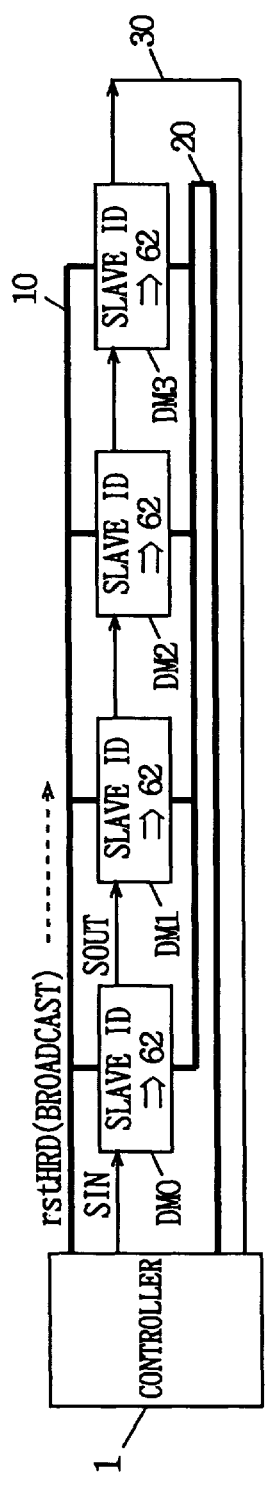
FIGS. 10A through 10D show the structure and an initialization sequence of a conventional memory system.
Figure 10B:
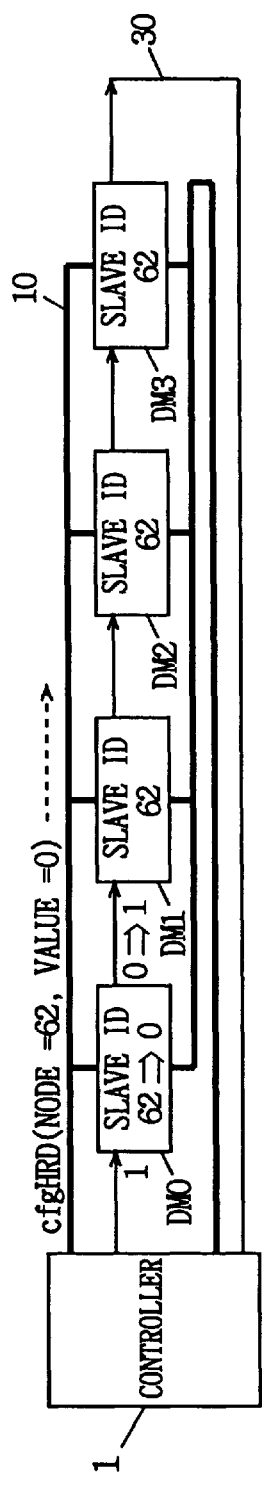
Figure 10C:
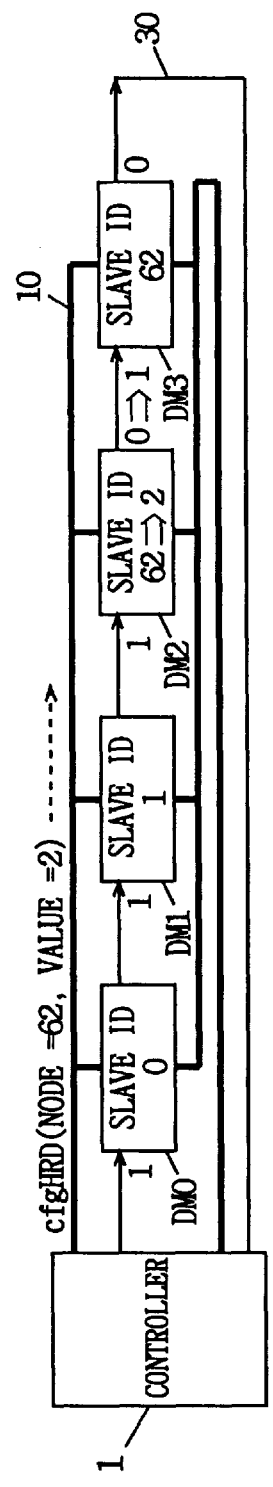
Figure 10D:
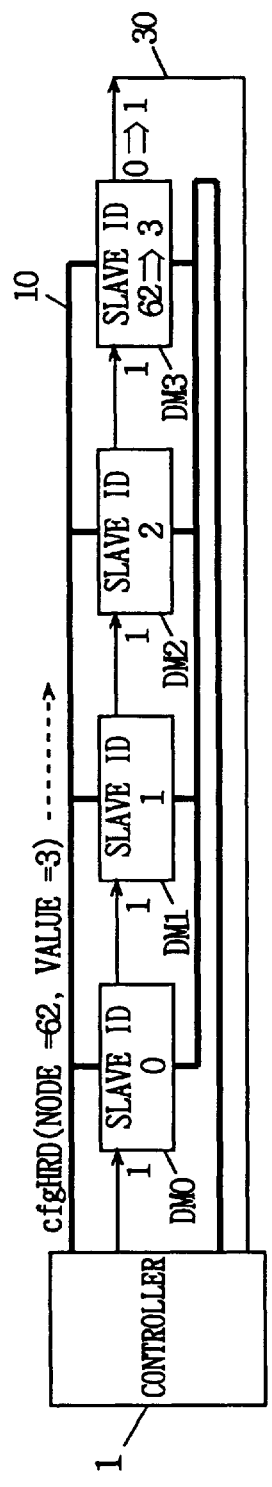

FIG. 2 is a schematic diagram showing a structure of a packet applied via send link 10. Referring to FIG. 2, the packet includes an identifier area 62 for storing a slave ID, a command area 64 for storing a command, and an information area 66 for storing information such as address, data size and written data. This packet shown in FIG. 2 is transmitted to send link 10 in synchronization with a clock signal (not shown). A packet of similar information only is also sent to sync link 20. The structure of the memory system is the same as that of the memory system shown in FIG. 10A. Description of the operation will now be described in the following with reference to the flow chart shown in FIG. 3.

First, the controller executes an initialization sequence for setting the slave ID of the semiconductor memory device (memory) included in the memory system (step S1). This setting of slave ID is executed in a sequence which is the same as that of FIGS. 10A through 10D described previously. Determination is made on whether the setting of slave IDs for all semiconductor memory devices (memories) included in the memory system is completed or not (step S2). These steps S1 and S2 are executed until setting of the slave IDs of all semiconductor devices is complete.

When setting of the slave IDs of all semiconductor devices is complete, then the controller issues a test command with the slave ID onto send bus 10 (step S3). This slave ID is started from 0.

In the memory system, the semiconductor memory device (memory) having a slave ID which is the same as the slave ID sent to this send bus 10 is started up, and command decoder 52 starts the built-in testing circuit 58. Built-in testing circuit 58 operates memory portion 56 in accordance with the test execute order from this command decoder 52 in a prescribed sequence to determine whether this memory portion 56 is operated normally or not.

An example of the testing operation performed by this built-in testing circuit 58 is a test mode operation of determining whether all of the memory cells included in memory portion 56 store data normally. In this test mode, built-in testing circuit 58 generates write data which is applied to memory portion 56 and successively writes data into the memory cells included in this memory portion 56. Then, it reads out the data stored in the memory cells from the memory portion 56 to determine whether this read out data are consistent with the write data.

The result of testing is sent by this built-in testing circuit to output buffer 60, and is latched therein. (This test result may also be stored in the register included in built-in circuit 58.) Then, memory (semiconductor memory device) DM sends the test result information to sync link 20 via output buffer 60 under the control of command decoder 52.

The controller receives the result of test execution applied via this sync link 20 to determine whether this memory is normal or not (step S4). Thereafter, the controller determines whether the testing is completed for all of the memories or not (step S5). If testing is not complete for all of the memories, the controller increments the slave ID by one and transmits the test command to send link 10 again (step S6). If reception of testing operation and test execution results for all memories is completed in step S5, pass/fail of the semiconductor memory device included in the memory system is identified. The test result may also be sent together with the slave ID.

In accordance with the result of pass/fail determination of this semiconductor memory device, memory controller 1 does not make an access to the defective semiconductor memory device upon operation.

In the above description, when a test command is issued in step S3, the semiconductor memory device (memory) sends the result of testing to sync link 20 via output buffer 60 after a prescribed time period according to this test command. In this case, however, the semiconductor memory device (memory) DM may also send the test result information from its built-in testing circuit 58 to sync link 20 via output buffer 60 according to this test result send command (as shown with parentheses in FIG. 3).

Figure 4:
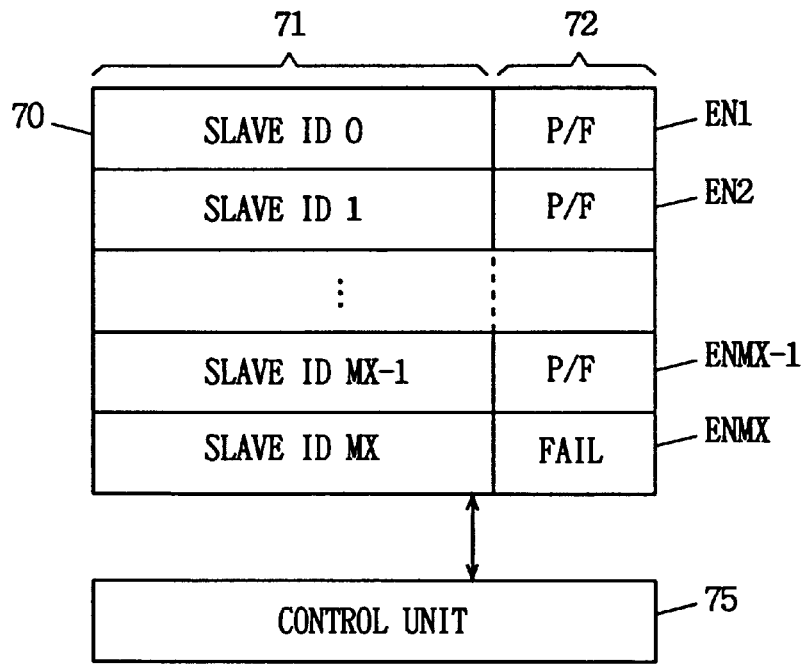
FIG. 4 shows an example of a method of memory management of a controller in Embodiment 1 of the present invention.

FIG. 4 is a schematic diagram of a structure of the access control portion included in the controller. Referring to FIG. 4, the controller includes a memory management table 70 and a control unit 75 for issuing the commands while making reference to this memory management table 70. Memory management table 70 includes a slave ID storage area 71 and a pass/fail flag storage area 72. This memory management table 70 includes one entry EN for respective ones of the slave IDs, and each of the slave entries EN (EN1 to ENMX) stores a slave ID and a pass/fail flag P/F. In the table 70 of FIG. 4, a slave ID set complete signal from the memory system via a signal line 30 is returned back before the issuance of a maximum slave ID MX, and the maximum salve ID MX does not have a corresponding semiconductor memory device. Accordingly, the pass/fail flag of this slave ID MX is set at a fail state FAIL and issuance of this maximum slave ID MX is inhibited. Similarly, in this pass/fail flag storage area 72, issuance of the slave ID corresponding to the entry set at fail state is inhibited. Accordingly, the controller will not access any defective memory and can always use only the normal memories to perform a processing operation, so that erroneous operation in the system due to defective memory can be prevented.

Modification

Figure 5:
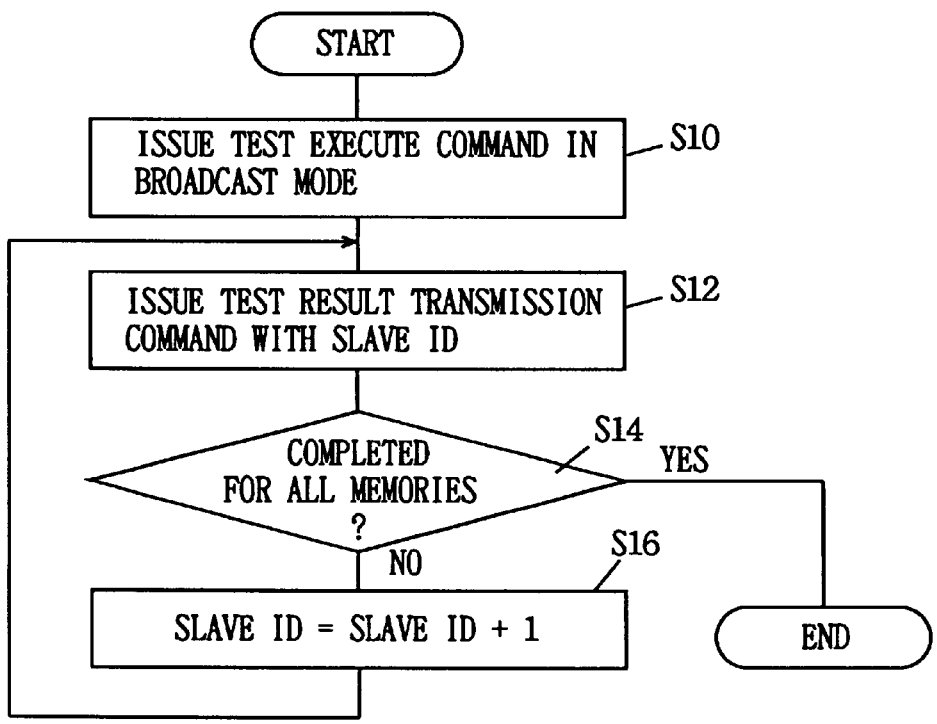
FIG. 5 is a flow chart representing the operation in a modification of Embodiment 1 according to the present invention.

FIG. 5 is a flow chart for illustrating the operation in a modification of Embodiment 1 according to the present invention. Description will be made of the operation in the modification of Embodiment 1 according to the present invention in the following with reference to this flow chart shown in FIG. 5.

When the slave ID setting sequence to the semiconductor memory devices (memory) in the memory system is complete (steps S1 and S2 of FIG. 3), the memory controller sends the test execute command in broadcast mode to send link 10 (step S10). In broadcast mode, all of the memories (semiconductor memory devices) included in the memory system execute the applied command. Accordingly, in semiconductor memory device DM, built-in testing circuit 58 operates under the control of command decoder 52 so as to execute a prescribed testing operation to memory portion 56. The result of this testing is transmitted to output buffer 60 via built-in testing circuit 58 and is latched therein. The test execute command in this step S10 causes all of the memories (semiconductor memory devices) in the memory system to execute the testing by the built-in testing circuits simultaneously, and to hold the result of testing in the output buffers (or their own internal registers).

Then, when a prescribed time period has passed, controller 1 sends a test result transmit command with the slave ID (identifier) to send link 10 (step S12). In the memory system, memory (semiconductor memory device) DM designated by this slave ID decodes the test result transmit command and sends the test result information latched in its output buffer or built-in testing circuit together with its own slave ID to sync link 20. The controller creates the memory management table shown in FIG. 4 according to this test result information sent. Then, the controller determines whether the test result from all of the memories included in the memory system has been sent out or not, according to this returned slave ID or slave ID included in the issue command (step S14). When there is a memory (semiconductor memory device) which is not transmitting the test result yet, the controller increments the slave ID by one and sends it to send link 10 again with the test result transmit command (S16). When test result transmit operation is complete for all of the memories (semiconductor memory devices) DM in step S14, the pass/fail identification sequence of memory (semiconductor memory device) DM is terminated. It is not especially required that the slave ID be sent back.

In the case of this operation sequence shown in FIG. 5, all memories included in the memory system simultaneously execute the testing operation on the memory portion (internal circuit) by their built-in testing circuits. Therefore, as compared to the case in which testing of the memories in the memory system is performed sequentially according to the test execute command from the controller, the time required for testing is reduced, and thus the time required for pass/fail determination for the memory can be reduced.

As described above, according to Embodiment 1 of the present invention, determination of pass/fail of the internal circuit (memory portion) of each memory is performed in accordance with the built-in testing circuit in the initialization sequence and the result of determination is sent to the controller, so that defective memory is not employed in normal use and it is possible to prevent erroneous operation of the system owing to such defective memory so that a highly reliable memory system can be constructed.

Embodiment 2

Figure 6:
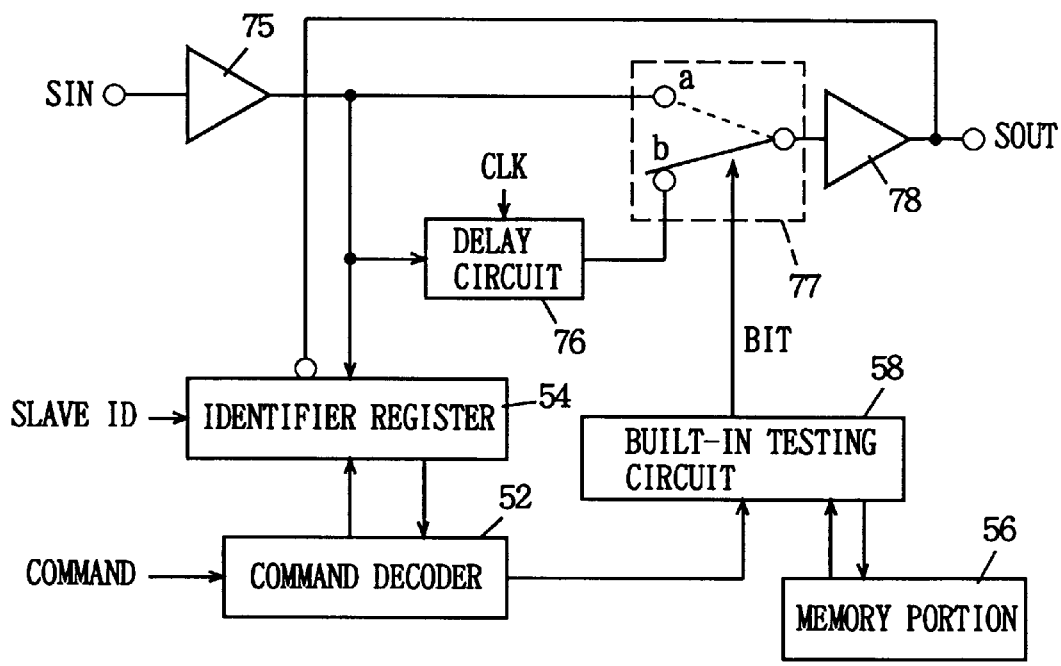
FIG. 6 is a schematic diagram showing the structure of a main portion of a semiconductor memory device according to Embodiment 2 of the present invention.

FIG. 6 is a diagram showing a main portion of a semiconductor memory device according to Embodiment 2 of the present invention. Referring to FIG. 6, the semiconductor memory device includes a buffer 75 for amplifying (i.e., buffering) a signal applied to a select input SIN, a delay circuit 76 operating in synchronization with a clock signal (i.e., system clock) CLK for delaying the signal applied from buffer 75 by a prescribed time period, a selecting circuit 77 for selecting one of the output signal from buffer 75 and the output signal from delay circuit 76 according to a test result indicating signal BIT from a built-in testing circuit 58, and a buffer 78 for buffering (i.e., amplifying) the output signal from selecting circuit 77 for transmission to select output node SOUT.

An identifier register 54 is enabled when the output signal of this buffer 75 is at H level and the output signal of buffer 78 is at L level, and stores a slave ID applied via a send bus under the control of command decoder 52. Built-in testing circuit 58 performs a prescribed testing on a memory portion 56, stores the result of testing at a latch (or register) not shown, and outputs test result information indicating signal BIT under the control of command decoder 52.

When this test result indicating signal BIT from built-in testing circuit 58 indicates failure, selecting circuit 77 selects the output signal of buffer 75 applied to its input node a while selecting the output signal of delay circuit 76 applied to its input node b when test result indicating signal BIT indicates normal. In the following, operation of the semiconductor memory device shown in this FIG. 6 will be described with reference to the flow chart shown in FIG. 7.

First, the slave ID stored in identifier register 54 is set at an initial value (62) according to a slave ID initialization command (rstHRD) from the controller (step S20).

After setting this slave ID to a initial value (62), the controller issues a test execute command (step S22). This test execute command may also be issued with the slave IDs set at initial value (62) or it may be issued in broadcast mode. According to this test execute command, built-in testing circuit 58 performs a testing operation on memory portion 56 under the control of command decoder 52. Depending on the result of this testing, built-in testing circuit 58 sets the state of test result indicating signal BIT to either one of pass/fail. When memory portion 56 is normal, selecting circuit 77 selects the output signal of delay circuit 76, while selecting the output signal of buffer 75 according to this test result indicating signal BIT when memory portion 56 is defective.

Then, a set command (cfgHRD) of the slave ID of each memory is issued. Identifier register 54 can store the slave ID when the output signal of buffer 75 is at H level and the output signal of buffer 78 is at L level. When this memory portion 56 is defective and selecting circuit 77 is selecting the output signal of buffer 75 in accordance with test result indicating signal BIT from built-in testing circuit 58, and if select input node SIN is set at H level, select output node OUT is also set at H level in response. Therefore, writing of the slave ID to identifier register 54 is inhibited in this case, and writing of the slave ID to a memory (semiconductor memory device) of the next stage is performed. In other words, identifier is not allocated to the defective memory (semiconductor memory device) so that the controller would ignore this defective memory, and access to the defective memory is prevented.

Determination is made on whether this setting of the slave ID has been done for all of the memories (step S26). This determination operation is based upon whether a completion signal at H level is returned back from control line 30, as in the previously described Embodiment 1 (step S26). When there is a memory to which setting of the slave ID is not performed, then the slave ID is incremented by one and set command of the slave ID is issued again (step S28). When setting of the slave ID is complete for all of the memories, the initialization sequence including identification of a defective memory is completed.

Based on the foregoing, by a structure in which one of the output signals from buffer 75 and delay circuit 76 is selected according to the output signal of built-in testing circuit 58, allocation of a slave ID to a defective memory can be inhibited so that the controller would operate as if this defective memory does not exist in the memory system, and thus it is possible to prevent erroneous operation of the system owing to the defective memory (because the defective memory would not be accessed).

The delay time of delay circuit 76 is a time period required between the issuance of identifier set command (cfgHRD) and storage of the slave ID into identifier register 54. Instead of employing this delay circuit 76, a flag storage portion may be provided at identifier register 54, setting the flag at H level after the slave ID is stored (under the control of command decoder 52).

Figure 7:
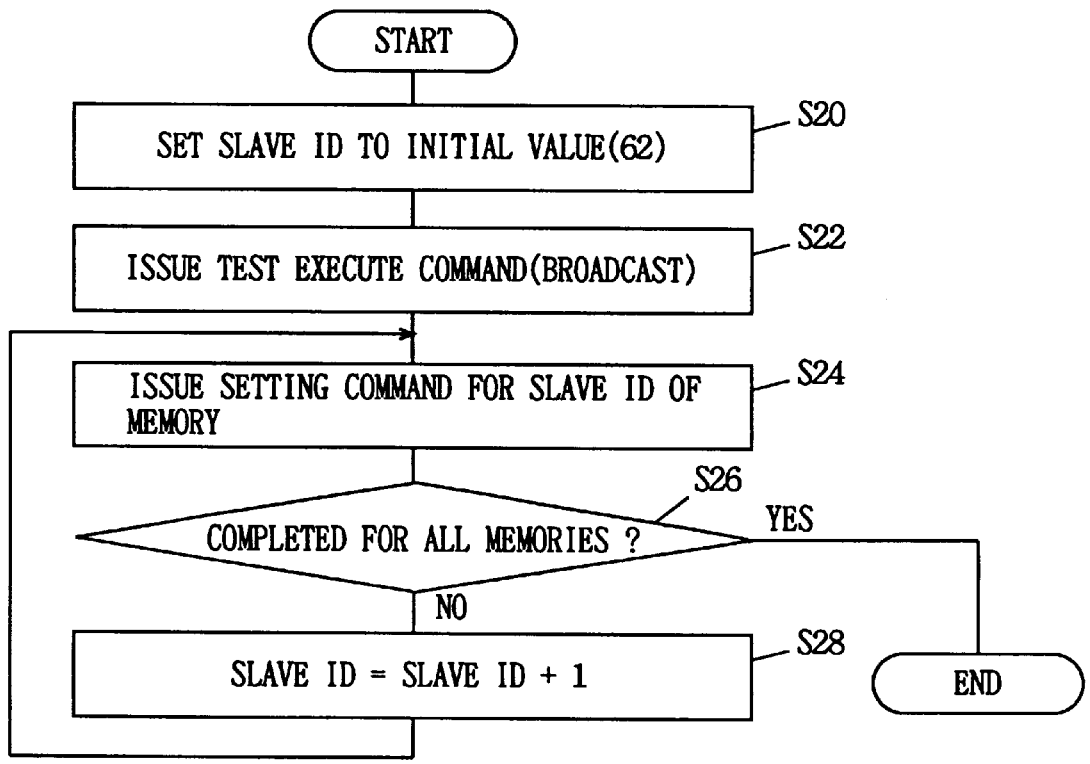
FIG. 7 is a flow chart representing the operation in Embodiment 2 of the present invention.

In addition, in the flow chart of FIG. 7, a setting sequence for the slave IDs of the memories similar to the sequence in the conventional example may be performed after issuance of test execute command. In other words, step S20 and step S22 may be exchanged.

A structure in which test execute command is not issued and built-in testing circuit 58 performs a testing operation as its initialization sequence in each memory upon start up of the system may also be employed.

In this Embodiment 2, the controller does not need provision of an area for storing pass/fail flag P/F in memory management table 70 as shown in FIG. 4.

Based upon the foregoing, in accordance with Embodiment 2 of the present invention, since the signal applied to the select input node is directly transmitted to the select output node (in other words, the select input node and the select output node are electrically and directly coupled) according to the result of determination of pass/fail of the internal circuit (memory portion) by the built-in testing circuit provided in each of the memories, setting (allocation) of the slave ID to a defective memory is inhibited, and thus it is possible to prevent an access to the defective memory, to prevent erroneous operation of the system owing to the operation of the defective memory, and to construct a highly reliable memory system.

Embodiment 3

Figure 8:
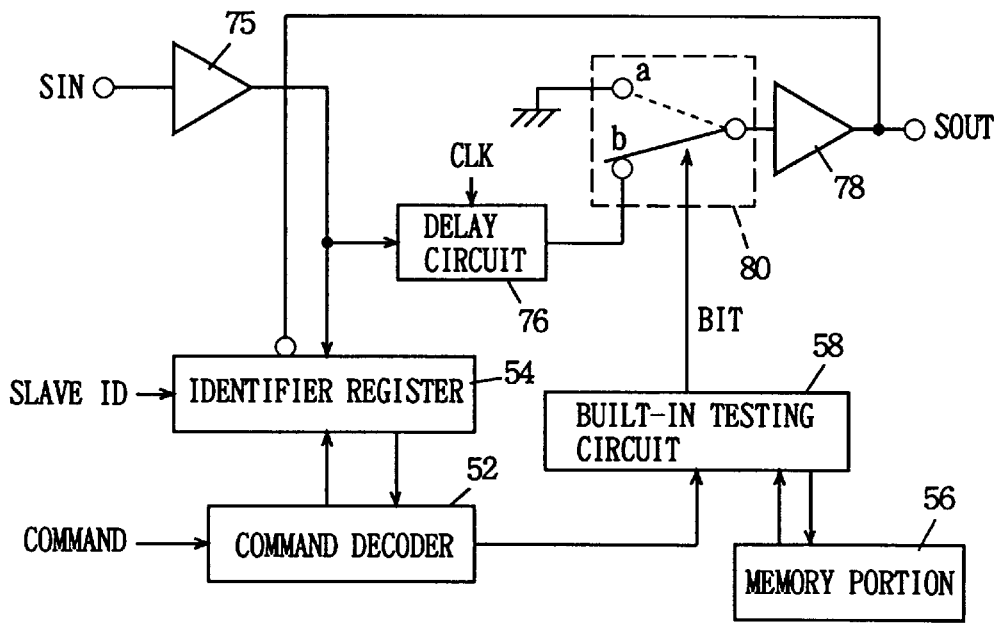
FIG. 8 is a schematic diagram showing a main portion of a semiconductor memory device according to Embodiment 3 of the present invention.

FIG. 8 is a schematic diagram showing the principal portion of a memory (semiconductor memory device) according to the present invention. In the structure shown in FIG. 8, a selecting circuit 80 is provided at a stage in front of a buffer 78 which drives select output node SOUT, and selects one of an output signal of a delay circuit 76 and a ground potential according to test result indicating signal BIT from a built-in testing circuit 58. Other portions of the structure are the same as the structure shown in FIG. 6, and thus corresponding portions are denoted by the same reference numerals and detailed description thereof is not provided.

Selecting circuit 80 selects the ground potential applied to node, a, when test result indicating signal BIT indicates a failure in a memory portion 56, while selecting the output signal of delay circuit 76 applied to input node, b, when test result indicating signal BIT indicates that the memory portion 56 is normal. In FIG. 8, when there is a failure in memory portion 56, selecting circuit 80 outputs an L level (ground potential level) signal and thus a select output node SOUT is always fixed at L level, that is, at an inactivated state. Consequently, even though the slave ID is stored into identifier register 54 of this semiconductor memory device, select input SIN of a memory at the next stage of the memory system is fixed at inactivated state of L level, and thus setting of the slave IDs is inhibited for the subsequent stages. Description will now be given for the operation of the memory system having the memory shown in FIG. 8, with reference to the flow chart of FIG. 9.

First, the controller sends initialization command rstHRD in broadcast mode via the send link to set the slave IDs of all memories (semiconductor memory devices) included in the memory system at an initial value (62) (step S30).

Then, the controller issues a test execute command in broadcast mode to the send link (step S31). In accordance with this test execute command, built-in testing circuit 58 is activated according to a test operation activation signal from command decoder 52 to perform a prescribed testing operation on memory portion 56, and according to the result of this testing, test result indicating signal BIT is set at a corresponding state. When memory portion 56 is normal, selecting circuit 80 selects the output of delay circuit 76, and on the other hand, it selects the signal of ground potential level at L level when memory portion 56 is defective.

When a prescribed time period (that is, the time required for the testing operation) has passed, the controller issues a set command (cfgHRD) for setting the slave ID to the memory included in this memory system (step S32). Upon issuance of this set command, the controller outputs a signal at H level to select input SIN of the adjacent memory, as already described with reference to FIGS. 10A–10D. In this way, storage of the slave ID for the memory designated by the slave ID (identifier) into identifier register 54 is performed.

The controller determines whether setting of the slave ID is completed for all the memories included in the memory system by checking if the slave ID setting complete signal returned back from the memory system (the signal transmitted to signal line 30 from select output node SOUT of the last stage of the memory system) is set at H level or not (step S33). When the signal applied via signal line 30 shown in FIGS. 10A-10D are at H level, the controller determines that setting of the slave ID is completed for all the memories included in the memory system and ends the initialization sequence.

Meanwhile, when this signal applied via signal line 30 is at L level, the controller determines that setting of the slave ID is not completed for all the memories. Then, the controller makes a determination on whether the currently issued slave ID has the maximum value (62) or not. If the slave ID has the maximum value (62) and the signal applied from signal line 30 shown in FIGS. 10A–10D are fixed at L level, it means that there is at least one defective memory in the memory system. More particularly, select input node SIN of the stage next to the defective memory (the memory having a slave ID greater by one) is fixed at L level, and accordingly, its select output SOUT is also fixed at L level. In other words, the select output node of a defective memory is fixed at L level. In this case, the controller generates a failure indication to inform the user that there is a defective memory in the memory system (step S35).

Meanwhile, when the slave ID does not have the maximum value, the controller increments the slave ID by one and returns to step S32 again, to issue slave ID set command cfgHRD.

In this Embodiment 3, the user may replace the entire memory system when failure indication is provided, or the controller may support an order to send test result indicating signal BIT of built-in testing circuit 58 to the sync link to identify the defective memory, as in Embodiment 1. Since the slave ID is stored in identifier register 54 in the defective memory, this defective memory can be identified.

Figure 9:
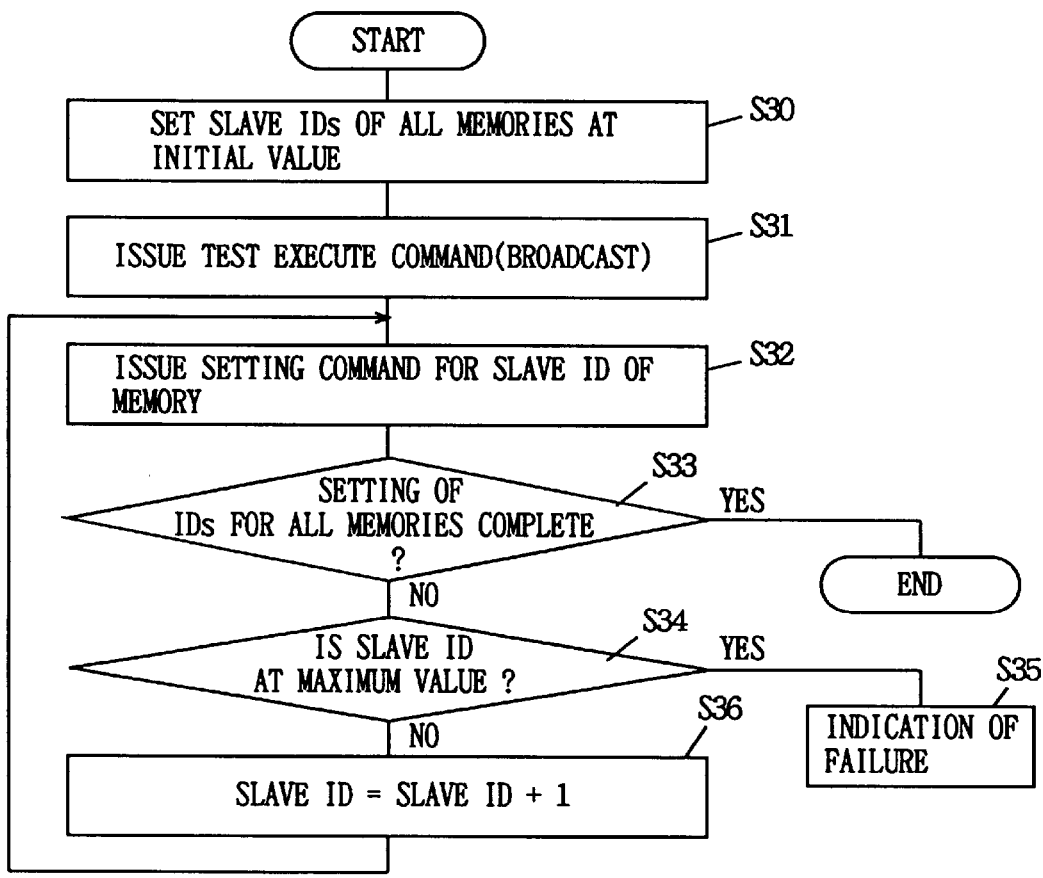
FIG. 9 is a flow chart representing the operation in a memory system according to Embodiment 3 of the present invention.

In the flow chart of this FIG. 9 also, steps S30 and S31 may be exchanged so as to perform a sequence for setting the slave IDs for all memories after issuance of test execute command upon start up of the system.

Other Applications

Although DRAM is employed as the memory in the above description, this memory may also be other types of memory such as non-volatile memory (flash memory).

In addition, the bus structure of the memory system may be other than the structure having a send link and a sync link. As long as the memory system has a plurality of memories connected in parallel to the controller through a bus and the plurality of memories are identified by identifiers, the present invention is applicable.

Although detailed description of the internal circuit of the testing circuit is not given, any circuit is available as long as it is a built-in testing circuit (BIST: built-in self-testing circuit) supported in a standard DRAM.

Any controller is acceptable as long as it can send the value of the slave ID while successively incrementing a built-in counter not shown in its initialization sequence is used, and its internal structure is arbitrary.

In addition, any controller is acceptable if it can send a next slave ID set command after a time period (latency) required for the storage of salve ID in a memory and the memory's select output node SOUT to attain H level has passed, and the timing of such sending can be adjusted by counting a clock signal by a built-in timer.

Moreover, this controller may also be a processor itself. Also, the controller may be connected to a processor via the system bus.

Based upon the foregoing, in accordance with the present invention, since a built-in testing circuit is provided in each of the memories included in the memory system and the result of testing by the built-in testing circuit is transmitted to the controller/processor upon initialization of the memory system, defective memories are not used during the operation of the system, and a highly reliable memory system can be constructed.

Although the present invention has been described and illustrated in detail, it is clearly understood that the same is by way of illustration and example only and is to be taken by way of limitation, the spirit and scope of the present invention being limited only by the terms of the appended claims.

What is claimed is:

1. A memory system including a plurality of semiconductor memory devices connected in parallel to a memory controller through a bus, said plurality of semiconductor memory devices each comprising:
   test circuitry for testing an internal circuit of its own semiconductor memory device according to a test execute command provided through said bus from said memory controller; and
   transfer circuitry for transferring the test result information to said memory controller according to a test result transmission command provided through said bus from said memory controller.

2. The memory system as recited in claim 1, wherein said bus includes a first link for transmission of said test result execute command and said test result transmission command and a second link different from said first link for transmission of said test result information.

3. The memory system as recited in claim 1, wherein each of said semiconductor memory devices includes a storage circuit for storing an identifier determined uniquely within said memory system, said test result transmission command being applied with said identifier;
   each of said semiconductor memory device further comprises:
   a circuit for executing said test result transmission command when an identifier applied from said memory controller matches with an identifier stored in said storage circuit.

4. The memory system as recited in claim 1, wherein said test execute command is a broadcast command commonly issued to said plurality of semiconductor memory devices and simultaneously executed.

5. A semiconductor memory device employed in a memory system, comprising:
   test circuit for testing an internal circuit;
   test result storage for storing test result information of said test circuit;
   a controller for activating said test circuit in response to a test execute command for testing said internal circuit provided through a bus;
   an identifier input enable node for indicating allowance of identifier input as well as an identifier output enable node for indicating completion of setting of the identifier;
   an identifier storage enabled when said identifier input enable node and said identifier output enable node are respectively activated and inactivated to receive and store an identifier provided through said bus; and
   coupling circuitry for electrically coupling said identifier input enable node and said identifier output enable node when the test result information of said test result storage indicates failure in said internal circuit to inhibit storage of the identifier to said identifier storage.

6. A semiconductor memory device employed in a memory system, comprising:
   test circuitry for testing an internal circuit of the semiconductor device;
   test result storage for storing a test result information of said test circuitry;
   control circuitry for activating said test circuitry in response to a test execute command provided through a bus;

an identifier input enable node for indicating allowance of identifier input;

an identifier output enable node for indicating completion of setting of the identifier;

an identifier storage enabled when said identifier input enable node and said identifier output enable node are respectively activated and inactivated to receive and store an identifier provided through said bus; and inhibition circuitry for fixing said identifier output enable node at an inactive state when test result information of said test result storage indicates failure in said internal circuit.

7. The semiconductor memory device as recited in claim 5, wherein said memory system includes a plurality of said semiconductor memory devices connected in parallel through said bus; and said identifier input enable node is connected to an identifier output enable node of said semiconductor memory device of an immediately previous stage in said memory system and said identifier output enable node is connected to an identifier input enable node of the semiconductor memory device of the next stage in said memory system.

8. The semiconductor memory device as recited in claim 6, wherein said memory system includes a plurality of said semiconductor memory devices connected in parallel through said bus; and said identifier input enable node is connected to an identifier output enable node of said semiconductor memory device of an immediately previous stage of said memory system and said identifier output enable node is connected to an identifier input enable node of the semiconductor memory device of the next stage in said memory system.

9. A semiconductor memory device operating in accordance with a command from a controller, comprising:

test circuitry for testing an internal circuit of said semiconductor memory device according to a test execute command provided through a bus from said controller; and transfer circuitry for transferring the test result information to said controller according to a test result transmission command provided through said bus from said memory controller.

10. The semiconductor memory device according to claim 9, further comprising, input circuitry coupled to a first link for receiving said test execute command through said first link for application to said test circuit circuitry, and output circuitry coupled to a second link provided separately from said first link, for transferring said test result information to said controller.

11. The memory system according to claim 1, wherein said bus includes a first bus for transferring commands including said test execute command, and a second bus provided separately from said first bus and for communicating data with said plurality of semiconductor memory devices, and wherein said transfer means includes a transmitter for transmitting said test result information to said second bus.

12. The semiconductor memory system according to claim 1, wherein said internal circuit includes a memory circuit storing data, and said bus includes a first bus for transferring at least said test execute command, and a second bus provided separatedly from said first bus and for communicating data with said plurality of semiconductor memory devices, and said transfer means includes a selector coupled to said memory circuit and said test circuitry, for transferring said test result information to said second bus in accordance with said test result transmission command.

13. The semiconductor memory device according to claim 9, wherein said bus includes a first bus for transferring at least said execute command from said controller, and a second bus provided separatedly from said first bus, for communicating data with said semiconductor memory device, and said transfer circuitry includes an output circuit for transferring said test result information to said second bus.

14. The semiconductor memory device according to claim 9, wherein said internal circuit includes a data storage for strong data, and said bus includes a first bus for transferring at least said test execute command, and a second bus provided separatedly from said first bus, for communicating data with said semiconductor memory device, and said transfer circuitry includes as output circuit coupled to said data storage and to said test circuitry, for transferring the test result information to said second bus in accordance with said test result transmission command.

* * * * *

UNITED STATES PATENT AND TRADEMARK OFFICE
CERTIFICATE OF CORRECTION

PATENT NO. : 5,956,349
DATED : September 21, 1999
INVENTOR(S) : NAOYA WATANABE, et al.

Page 1 of 2

It is certified that error appears in the above-identified patent and that said Letter Patent is hereby corrected as shown below:

Column 12, line 20, delete "result".

Column 12, line 40, before "test" insert --a--.

Column 12, line 41, before "test" insert --a--.

Column 12, line 62, before "device" insert --memory--.

Column 12, line 63, before "test" insert --a--.

Column 14, line 10, delete "and".

Column 14, line 12, change "means" to --circuitry--.

Column 14, line 15, delete "semiconductor".

Column 14, line 21, change "separatedly" to --separately--; and delete "and".

Column 14, line 24, change "means" to --circuitry--.

Column 14, line 32, change "separatedly" to --separately--.

UNITED STATES PATENT AND TRADEMARK OFFICE
CERTIFICATE OF CORRECTION

PATENT NO. : 5,956,349
DATED : September 21, 1999
INVENTOR(S) : NAOYA WATANABE, et al.

It is certified that error appears in the above-identified patent and that said Letter Patent is hereby corrected as shown below:

Column 14, line 40, change "strong" to --storing--.

Column 14, line 43, change "separatedly" to --separately--.

Column 14, line 45, change "as" to --an--.

Signed and Sealed this

Nineteenth Day of September, 2000

Attest:

Q. TODD DICKINSON

*Attesting Officer*    *Director of Patents and Trademarks*